United States Patent
Hoshi

(10) Patent No.: US 6,703,185 B2
(45) Date of Patent: Mar. 9, 2004

(54) ON-PRESS DEVELOPING METHOD OF LITHOGRAPHIC PRINTING PLATE PRECURSOR

(75) Inventor: Satoshi Hoshi, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 10/299,719

(22) Filed: Nov. 20, 2002

(65) Prior Publication Data

US 2003/0104306 A1 Jun. 5, 2003

(30) Foreign Application Priority Data

Nov. 20, 2001 (JP) ......................................... 2001-354809

(51) Int. Cl.⁷ ................................................ G03F 7/26
(52) U.S. Cl. ...................................................... 430/302
(58) Field of Search .......................................... 430/302

(56) References Cited

FOREIGN PATENT DOCUMENTS

| | | |
|---|---|---|
| JP | 2938397 | 6/1999 |
| JP | 2001-253180 | 9/2001 |

*Primary Examiner*—Hoa Van Le
(74) *Attorney, Agent, or Firm*—Burns, Doane, Swecker & Mathis, LLP

(57) ABSTRACT

On-press developing method of a lithographic printing plate precursor, the lithographic printing plate precursor comprising an image-forming layer which comprises a hydrophobizing precursor, and the method comprising fountain solution-clarifying means which comprises: aggregating a hydrophobizing precursor mingled in a fountain solution and removing the aggregated hydrophobizing precursor by filtration; or adding a coagulant to a fountain solution and filtering the fountain solution.

13 Claims, No Drawings

ON-PRESS DEVELOPING METHOD OF LITHOGRAPHIC PRINTING PLATE PRECURSOR

FIELD OF THE INVENTION

The present invention relates to a method for on-press developing a lithographic printing plate precursor having an image-forming layer containing a hydrophobizing precursor. More specifically, the present invention relates to an on-press developing method of performing the on-press development by using fountain solution-clarifying means of removing the hydrophobizing precursor mingled into the fountain solution from the image-forming layer.

BACKGROUND OF THE INVENTION

Generally, the lithographic printing plate comprises a hydrophobic (ink-receptive) image area of repelling a fountain solution and receiving an ink in the printing process and a hydrophilic non-image area of receiving a fountain solution. Such a lithographic plate has been heretofore manufactured by subjecting a PS plate comprising a hydrophilic support having provided thereon an ink-receptive photosensitive resin layer to mask exposure through a lith. film and then dissolving and thereby removing the photosensitive resin layer in the non-image area using a developer.

In recent years, digitization technology of electronically processing, storing and outputting image information using a computer has been widespread and in turn, demands are increasing for computer-to-plate (CTP) techniques where an image is directly formed on a lithographic printing plate precursor without intervention of a lith. film by scanning light having high directivity, such as laser light, according to the digitized image information.

In conventional manufacturing methods of a printing plate using a PS plate, the step of dissolving and thereby removing the non-image area after exposure is indispensable. Furthermore, an after-processing step of water-washing the developed printing plate or treating the plate with a rinsing solution containing a surfactant or with a desensitizing solution containing gum arabic, a starch derivative or the like is also necessary. These additional wet processing steps are cumbersome and particularly in view of care on the global environment, which is recently growing as a matter of great concern, raise another problem to be solved in conventional techniques.

Accordingly, simple processing, dry processing and no processing are more keenly demanded from both the environmental aspect and the aspect of more streamlining the steps accompanying the above-described digitization. More specifically, a printing plate precursor for CTP systems, which can be used as it is for printing without passing through any wet processing after image recording, is demanded.

As one of the methods for dispensing with the processing step, a method called on-press development is known, where an exposed printing plate precursor is fixed on a cylinder of a press, and a fountain solution and/or an ink are supplied while rotating the cylinder, thereby removing the non-image area of the image-forming layer of the printing plate precursor. Namely, this is a system of fixing a printing plate precursor as it is on a press after exposure and completing the processing in the course of normal printing.

As the CTP-use lithographic printing plate precursor suitable for such on-press development, for example, Japanese Patent 2,938,397 describes a lithographic printing plate precursor where a photosensitive layer comprising a hydrophilic binder polymer having dispersed therein thermoplastic hydrophobic polymer fine particles is provided on a hydrophilic support. In this patent publication, it is stated that the on-press development can be performed by exposing the lithographic printing plate with an infrared laser to cause combination (fusion) of thermoplastic hydrophobic polymer fine particles due to heat and thereby form an image, then fixing the plate on a plate cylinder of a press, and supplying a fountain solution and/or an ink.

Also, JP-A-2001-253180 (the term "JP-A" as used herein means an "unexamined published Japanese patent application") describes a technique where a heat-sensitive lithographic printing plate precursor comprising an aluminum support having an anodic oxide film and having on the support a hydrophilic layer which contains a hydrophilic binder and a microcapsule enclosing a hydrophobic component and converts into an image area by heat can be on-press developed.

SUMMARY OF THE INVENTION

However, these lithographic printing plate precursors have a problem in that when many plates are continuously on-press developed, printing staining occurs. The object of the present invention is to solve this problem. That is, the object of the present invention is to provide an on-press developing method where even if the on-press development is continued, printing staining does not occur.

The present invention is as follows.

1. A method for on-press developing a lithographic printing plate precursor having an image-forming layer containing a hydrophobizing precursor, the method having fountain solution-clarifying means of aggregating a hydrophobizing precursor mingled in the fountain solution and removing it by filtration.

2. A method for on-press developing a lithographic printing plate precursor having an image-forming layer containing a hydrophobizing precursor, the method having fountain solution-clarifying means of adding a coagulant (flocculant) to the fountain solution and filtering said fountain solution.

The present inventors have presumed that the above-described printing staining occurred on continuously on-press developing many plates is generated because the components in the removed image-forming layer increase in the fountain solution as the on-press development continues and these deteriorate the on-press developability or adhere to the non-image area of the printing plate. Therefore, studies have been made to clarify the fountain solution by removing, out of image-forming layer components mingled in the fountain solution, a hydrophobizing precursor which becomes ink-receptive. The hydrophobizing precursor is a fine particle having a particle size of 0.01 to 20 $\mu$m and therefore, can be hardly removed only by normal filtration. The present inventors have found that the object of the present invention can be achieved by aggregating the fine particles using the surface electric charge thereof and removing the hydrophobizing component as an agglomerate easy to filter.

DETAILED DESCRIPTION OF THE INVENTION

The practical embodiment of the present invention is described in detail below. In the following, unless otherwise indicated, "%" is "mass % (% by weight)".

The lithographic printing plate precursor for use in the present invention is a lithographic printing plate precursor having an image-forming layer containing a hydrophobizing precursor.

The hydrophobizing precursor for use in the present invention is a fine particle capable of changing the hydrophilic image-forming layer to be hydrophobic upon application of heat and examples thereof include a thermoplastic polymer fine particle, a thermosetting polymer fine particle, a polymer fine particle having a heat-reactive functional group, and a microcapsule enclosing a hydrophobic substance, which are dispersed in the hydrophilic image-forming layer. When heat is applied, the polymer fine particles are fused or reacted with each other and combined or the capsule wall of the microcapsule is ruptured to cause bleeding of the hydrophobic substance out of the capsule, whereby the hydrophilic image-forming layer is changed to be hydrophobic. These fine particles can be used individually or in combination of two or more in the image-forming layer.

Suitable examples of the thermoplastic polymer fine particle for use in the present invention include thermoplastic polymer fine particles described in *Research Disclosure*, No. 33303 (January, 1992), JP-A-9-123387, JP-A-9-131850, JP-A-9-171249, JP-A-9-171250 and EP931647. Specific examples of the thermoplastic polymer include monomers and homopolymers of ethylene, styrene, vinyl chloride, methyl acrylate, ethyl acrylate, methyl methacrylate, ethyl methacrylate, vinylidene chloride, acrylonitrile and vinyl carbazole, and mixtures thereof. Among these, preferred are polystyrene and polymethyl methacrylate.

These thermoplastic polymers can be formed into fine particles by an emulsion polymerization described in U.S. Pat. No. 3,476,937 or a method of dissolving the thermoplastic polymer in a water-immiscible solvent and emulsion-dispersing the solution in an aqueous phase.

Examples of the thermosetting polymer fine particle for use in the present invention include resins having a phenol skeleton, urea-base resins (for example, urea or a urea derivative such as methoxymethylated urea, which is resinified with an aldehyde such as formaldehyde), alkyd resins, unsaturated polyester resins, polyurethane resins and epoxy resins.

Suitable examples of the resin having a phenol skeleton include phenolic resins obtained by resinifying phenol or cresol with an aldehyde such as formaldehyde, hydroxystyrene resin, methacrylamide or acrylamide resins having a phenol skeleton, such as N-(p-hydroxyphenyl) methacrylamide, and methacrylate or acrylate resins having a phenol skeleton, such as p-hydroxyphenyl methacrylate. Among these thermosetting polymers, preferred are resins having a phenol skeleton, melamine resins, urea resins and epoxy resins.

These thermosetting polymer fine particles can be synthesized by a method of dissolving the compound in a non-aqueous organic solvent, mixing and emulsifying the solution with an aqueous solution containing a dispersant, and dispersing the fine particles while evaporating the organic solvent under heating. Also, the polymer may be formed into fine particles at the time of synthesizing the thermosetting polymer. However, the present invention is not limited to these methods.

Examples of the heat-reactive functional group of the polymer fine particle having a heat-reactive functional group for use in the present invention include an ethylenically unsaturated group of undergoing a polymerization reaction, such as acryloyl group, methacryloyl group, vinyl group and allyl group; a functional group having an isocyanate group of undergoing an addition reaction, or a block form thereof and an active hydrogen atom as an another party of the reaction, such as amino group, hydroxyl group and carboxyl group; an epoxy group of undergoing an addition reaction and an amino group, a carboxyl group or a hydroxyl group as an another party of the reaction; a carboxyl group of undergoing a condensation reaction and a hydroxyl group or an amino group; and an acid anhydride of undergoing a ring-opening addition reaction and an amino group or a hydroxyl group. However, as long as a chemical bond is formed, the functional group may undergo any reaction.

The functional group may be introduced into the polymer fine particle at the polymerization or may be introduced by using a polymer reaction after the polymerization.

In the case of introducing the functional group at the polymerization, a monomer having such a functional group is preferably emulsion-polymerized or suspension-polymerized. Specific examples of the monomer having such a functional group include an allyl methacrylate, an allyl acrylate, a vinyl methacrylate, a vinyl acrylate, a glycidyl methacrylate, a glycidyl acrylate, a 2-isocyanate ethyl methacrylate or a block isocyanate thereof with an alcohol or the like, a 2-isocyanate ethyl acrylate or a block isocyanate thereof with an alcohol or the like, a 2-aminoethyl methacrylate, a 2-aminoethyl acrylate, a 2-hydroxyethyl methacrylate, a 2-hydroxyethyl acrylate, an acrylic acid, a methacrylic acid, a maleic anhydride, a bifunctional acrylate and a bifunctional methacrylate, however, the monomer having a functional group is not limited thereto.

In the emulsion-polymerization or suspension-polymerization, a monomer copolymerizable with the above-described monomer and having no heat-reactive functional group may be present together. Examples of this monomer include styrene, an alkyl acrylate, an alkyl methacrylate, an acrylonitrile and a vinyl acetate, however, the monomer is not limited thereto and any monomer may be used as long as it does not have a heat-reactive functional group.

Examples of the polymer reaction used in the case of introducing the heat-reactive functional group after the polymerization include the polymer reaction described in WO96-34316.

The solidifying temperature of the polymer fine particle having a heat-reactive functional group is preferably 70° C. or more and in view of aging stability, more preferably 100° C. or more.

The microcapsule for use in the present invention encloses a hydrophobic substance. The hydrophobic substance is preferably a compound having a heat-reactive functional group. Examples of the heat-reactive functional group include those described above as the functional group for use in the polymer fine particle having a heat-reactive functional group. These are described in more detail below.

The compound having a polymerizable unsaturated group is preferably a compound having at least one, preferably two or more ethylenically unsaturated bonds such as acryloyl group, methacryloyl group, vinyl group and allyl group. These compounds are widely known in the industrial field of this art and can be used in the present invention without any particular limitation. The chemical form thereof is a monomer, a prepolymer (namely, dimer, trimer or oligomer), or a mixture or a copolymer thereof.

Examples thereof include unsaturated carboxylic acids (for example, an acrylic acid, a methacrylic acid, an itaconic acid, a crotonic acid, an isocrotonic acid and a maleic acid), and esters and amides thereof. Among these, preferred are esters of an unsaturated carboxylic acid and an aliphatic polyhydric alcohol, and amides of an unsaturated carboxylic acid and an aliphatic polyvalent amine.

Furthermore, an addition reaction product of a monofunctional or polyfunctional isocyanate or an epoxide, or a dehydration condensation reaction product of a monofunctional or polyfunctional carboxylic acid, with an unsaturated carboxylic acid ester or unsaturated carboxylic acid amide having a nucleophilic substituent such as hydroxyl group, amino group or mercapto group, may also be suitably used.

Furthermore, an addition reaction product of an unsaturated carboxylic acid ester or amide having an electrophilic substituent such as isocyanate group or epoxy group with a monofunctional or polyfunctional alcohol, amine or thiol, or a substitution reaction product of an unsaturated carboxylic acid ester or amide having a releasable substituent such as halogen group or tosyloxy group with a monofunctional or polyfunctional alcohol, amine or thiol, is also suitably used.

Other suitable examples include compounds where the above-described unsaturated carboxylic acid is replaced by an unsaturated phosphonic acid or chloromethylstyrene.

Specific examples of the polymerizable compound which is an ester of an unsaturated carboxylic acid with an aliphatic polyhydric alcohol include the followings. Specific examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate and polyester acrylate oligomer.

Specific examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane and bis[p-(methacryloyloxyethoxy)phenyl]dimethylmethane.

Specific examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Specific examples of the crotonic acid ester include ethylene glycol dicrotonate, tetramethylene glycol dicrotonate, pentaerythritol dicrotonate and sorbitol tetradicrotonate. Specific examples of the isocrotonic acid ester include ethylene glycol diisocrotonate, pentaerythritol diisocrotonate and sorbitol tetraisocrotonate.

Specific examples of the maleic acid ester include ethylene glycol dimaleate, triethylene glycol dimaleate, pentaerythritol dimaleate and sorbitol tetramaleate.

Examples of other esters include aliphatic alcohol-base esters described in JP-B-46-27926 (the term "JP-B" as used herein means an "examined Japanese patent publication"), JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of an aliphatic polyvalent amine compound and an unsaturated carboxylic acid include methylene bis-acrylamide, methylene bis-methacrylamide, 1,6-hexamethylene bis-acrylamide, 1,6-hexamethylene bismethacrylamide, diethylenetriamine trisacrylamide, xylylene bisacrylamide and xylylene bismethacrylamide. Other preferred examples of the amide-base monomer include those having a cyclohexylene structure described in JP-B-54-21726.

A urethane-base addition polymerizable compound produced using an addition reaction between an isocyanate and a hydroxyl group is also suitably used and specific examples thereof include urethane compounds having two or more polymerizable unsaturated groups within one molecule obtained by adding an unsaturated monomer containing a hydroxyl group represented by the following formula (I) to a polyisocyanate compound having two or more isocyanate groups within one molecule, described in JP-B-48-41708.

$$CH_2=C(R^1)COOCH_2CH(R^2)OH \qquad (I)$$

(wherein $R^1$ and $R^2$ each represents H or $CH_3$)

Also, urethane acrylates described in JP-A-51-37193, JP-B-2-32293 and JP-B-2-16765, and urethane compounds having an ethylene oxide-base skeleton described in JP-B-58-49860, JP-B-56-17654, JP-B-62-39417 and JP-B-62-39418 may be suitably used.

Furthermore, radical polymerizable compounds having an amino structure or a sulfide structure within the molecule described in JP-A-63-277653, JP-A-63-260909 and JP-A-1-105238 may also be suitably used.

Other suitable examples include polyfunctional acrylates and methacrylates such as polyester acrylates and epoxy acrylates obtained by reacting an epoxy resin with a (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid-base compounds described in JP-A-2-25493 may also be suitably used. In some cases, the compounds containing a perfluoroalkyl group described in JP-A-61-22048 may be suitably used. Also, those described as a photocurable monomer or oligomer in *Nippon Secchaku Kyokai Shi* (*Journal of Japan Adhesion Society*), Vol. 20, No. 7, pp. 300–308 (1984) can be suitably used.

Suitable examples of the epoxy compound include a glycerin polyglycidyl ether, a polyethylene glycol diglycidyl ether, a polypropylene diglycidyl ether, a trimethylolpropane polyglycidyl ether, a sorbitol polyglycidyl ether, and a polyglycidyl ether of bisphenols, polyphenols or a hydrogenation product thereof.

Suitable examples of the isocyanate compound include a tolylene diisocyanate, a diphenylmethane diisocyanate, a polymethylene polyphenyl polyisocyanate, a xylylene diisocyanate, a naphthalene diisocyanate, a cyclohexane phenylene diisocyanate, an isophorone diisocyanate, a hexamethylene diisocyanate, a cyclohexyl diisocyanate, and compounds resulting from blocking these isocyanate compounds with an alcohol or an amine.

Suitable examples of the amine compound include ethylenediamine, diethylenetriamine, triethylenetetramine, hexamethylenediamine, propylenediamine and polyethyleneimine.

Suitable examples of the compound having a hydroxyl group include compounds having a terminal methylol group, polyhydric alcohols such as pentaerythritol, and bisphenol polyphenols.

Preferred examples of the compound having a carboxyl group include aromatic polyvalent carboxylic acids such as pyromellitic acid, trimellitic acid and phthalic acid, and aliphatic polyvalent carboxylic acids such as adipic acid.

Suitable examples of the acid anhydride include a pyromellitic anhydride and a benzophenone tetracarboxylic anhydride.

Suitable examples of the copolymer having an ethylenically unsaturated group include copolymers of allyl methacrylate, such as allyl methacrylate/methacrylic acid copolymer, allyl methacrylate/ethyl methacrylate copolymer, and allyl methacrylate/butyl methacrylate copolymer.

For the microencapsulation, a known method may be used. Examples of the method for producing a microcapsule include a method using coacervation described in U.S. Pat. Nos. 2,800,457 and 2,800,458, a method using interfacial polymerization described in British Patent 990,443, U.S. Pat. No. 3,287,154, JP-B-38-19574, JP-B-42-446 and JP-B-42-711, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method using monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074. However, the present invention is not limited thereto.

The microcapsule wall for use in the present invention preferably has a three-dimensional crosslinking and has properties of swelling by a solvent. In this viewpoint, the wall material of microcapsule is preferably polyurea, polyurethane, polyester, polycarbonate, polyamide or a mixture thereof, more preferably polyurea or polyurethane. The compound having a heat-reactive functional group may be introduced into the microcapsule wall.

These microcapsules may or may not combine with each other by heat. It may suffice if the content of microcapsule, bled out to the capsule surface or out of the microcapsule or impregnated into the microcapsule wall, causes a chemical reaction by heat. Also, it may be possible to produce two or more kinds of microcapsules having different functional groups which thermally react with each other, and react the microcapsules with each other. Accordingly, although the microcapsules are preferably-fused and combined by heat in view of image formation, this is not an essential matter.

The average particle size of the polymer fine particle and the microcapsule is preferably from 0.01 to 20 µm, more preferably from 0.05 to 2.0 µm, still more preferably from 0.10 to 1.0 µm. Within this range, good resolution and good aging stability can be obtained.

In case of any fine particle, the amount of the hydrophobizing precursor added to the image-forming layer is, in terms of solid content, preferably 20% or more, more preferably 30% or more, based on the solid content of the image-forming layer. Within this range, good image formation can be attained and good printing durability can be obtained.

In order to elevate the sensitivity, the image-forming layer of the present invention preferably contains a light-to-heat converting agent of converting light into heat. The light-to-heat converting agent may be sufficient if it is a substance capable of absorbing infrared light, particularly near infrared light (wavelength: from 700 to 2,000 nm). Various pigments, dyes and metal fine particles can be used.

For example, pigments, dyes and metal fine particles described in JP-A-2001-162960, JP-A-11-235883, *Nippon Insatsu Gakkai Shi* (*Journal of Japan Printing Society*), Vol. 38, pp. 35–40 (2001), and JP-A-2001-213062 may be suitably used.

The pigment is preferably carbon black. Examples of the metal fine particle include fine particles of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb, which are a simple substance or an alloy, and an oxide or sulfide thereof. Among these, preferred are Re, Sb, Te, Au, Ag, Cu, Ge, Pb and Sn, more preferred are Ag, Au, Cu, Sb, Ge and Pb. Preferred examples of the dye include the following dyes having a water-soluble group, however, the present invention is not limited thereto.

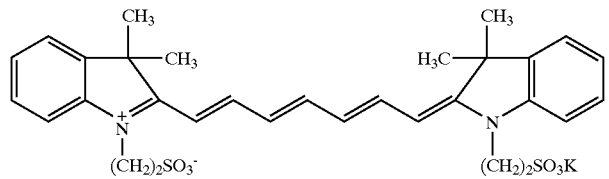

(IR-1)

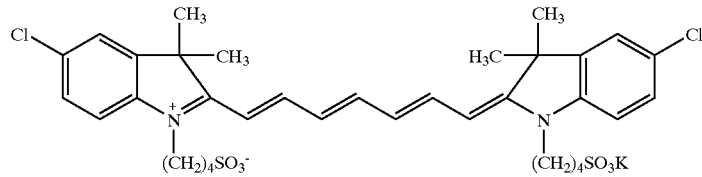

(IR-2)

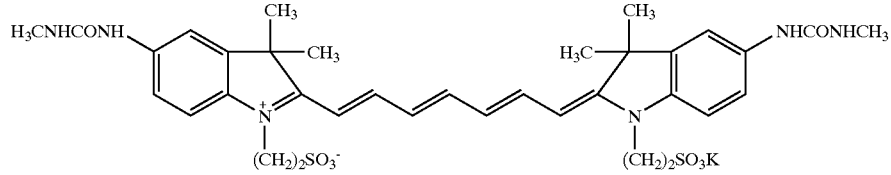

(IR-3)

-continued
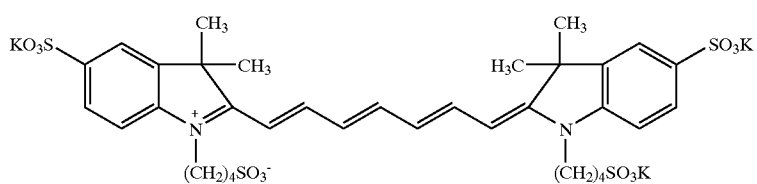
(IR-4)
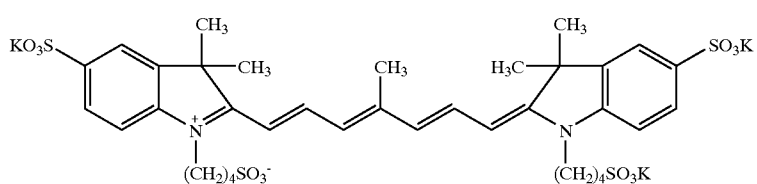
(IR-5)
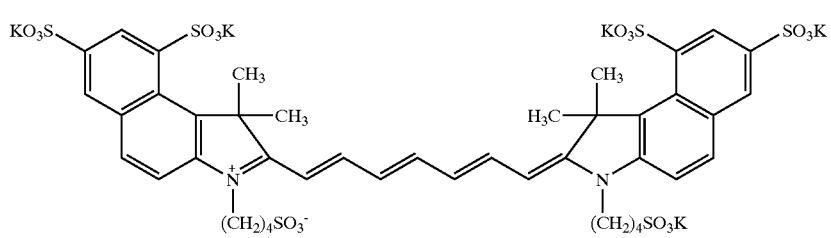
(IR-6)
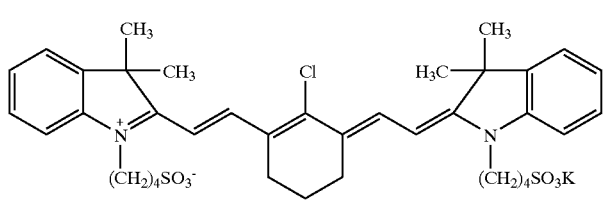
(IR-7)
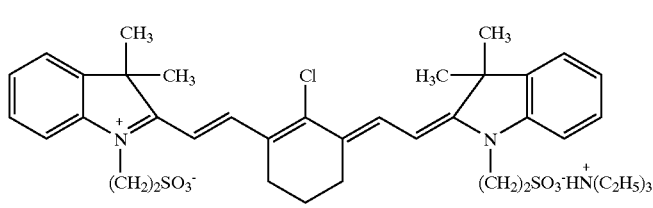
(IR-8)
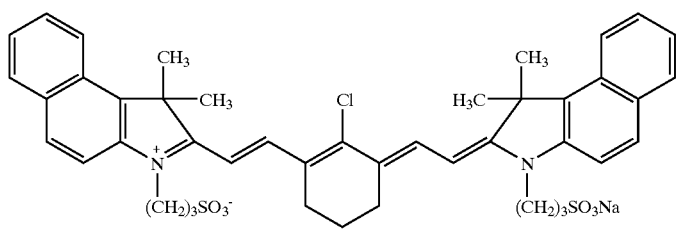
(IR-9)
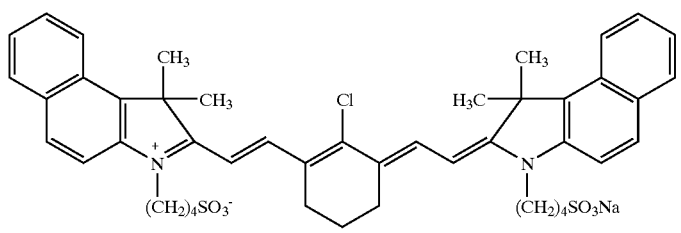
(IR-10)

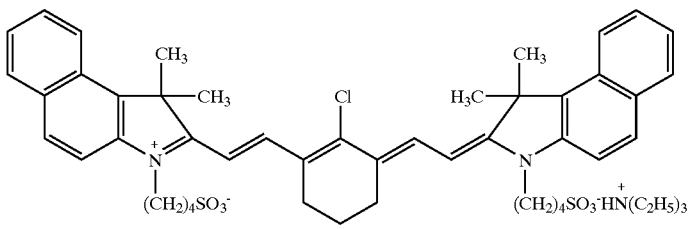
(IR-11)
In the case of using the light-to-heat converting agent by adding it to a polymer fine particle or into a microcapsule, the light-to-heat converting agent is preferably more ink-receptive and suitable examples thereof include the following dyes.
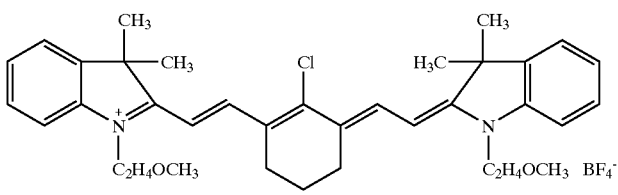
(IR-21)
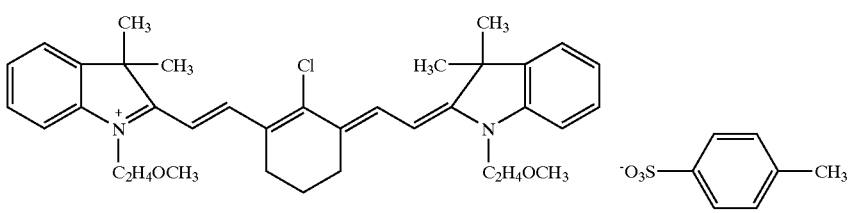
(IR-22)
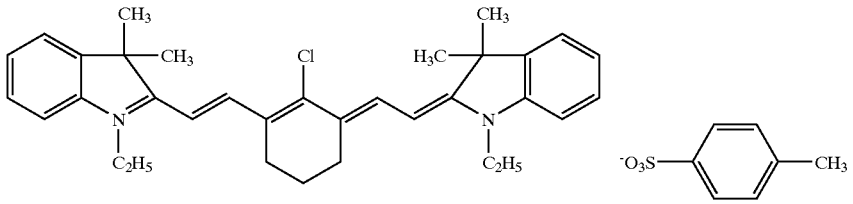
(IR-23)
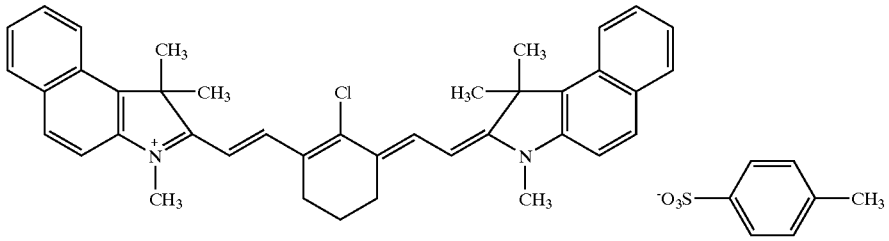
(IR-24)
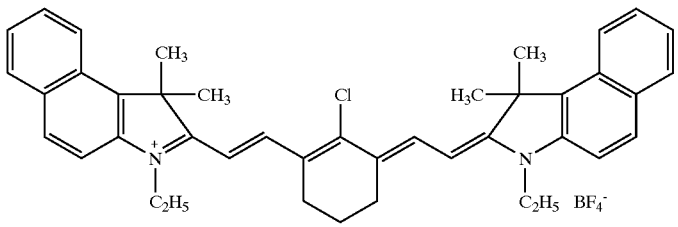
(IR-25)

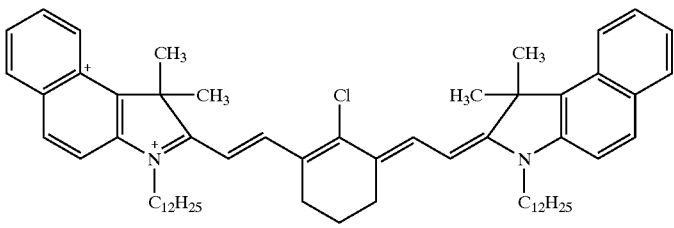
(IR-26)

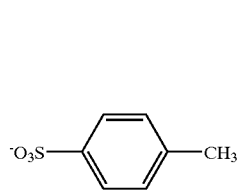
(IR-27)

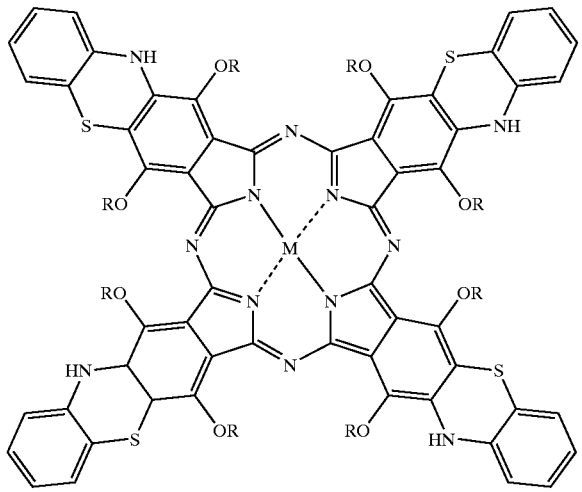

M = VO, R = i-C$_5$H$_{11}$

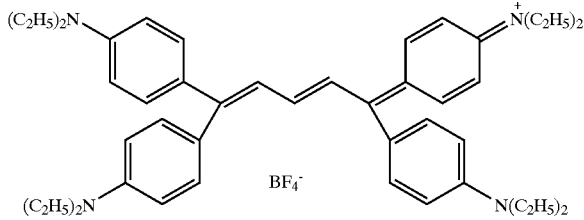
(IR-28)

In the case of adding a pigment or dye as the light-to-heat converting agent to the image-forming layer, the ratio added thereof is preferably from 0.1 to 50%, more preferably from 3 to 40%, to the solid content of the image-forming layer. In the case of using a metal fine particle as the light-to-heat converting agent, the ratio added thereof is preferably 5% or more, more preferably 10% or more, to the solid content of the image-forming layer. Within this range, good sensitivity can be obtained.

In the image-receiving layer for use in the present invention, a hydrophilic resin may be added so as to improve the on-press developability or the film strength of the image-forming layer. The hydrophilic resin preferably has no three-dimensional crosslinking because good on-press developability can be obtained.

The hydrophilic resin is preferably a resin having a hydrophilic group such as hydroxyl group, carboxyl group, hydroxyethyl group, hydroxypropyl group, amino group, aminoethyl group, aminopropyl group or carboxymethyl group.

Specific examples of the hydrophilic resin include gum arabic, casein, gelatin, soya gum, starch and derivatives thereof, cellulose derivatives (such as hydroxyethyl cellulose, hydroxypropyl cellulose, methyl cellulose, carboxymethyl cellulose and salts thereof, and cellulose acetate), alginic acid and alkali metal salts, alkaline earth metal salts or ammonium salts thereof, water-soluble urethane resin, water-soluble polyester resin, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene oxides, poly(propylene oxides), polyvinyl alcohols (PVA), hydrolyzed polyvinyl acetate having a hydrolysis degree of at least 60 mass %, preferably at least 80 mass %, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, and 2-acrylamide-2-methylpropane-sulfonic acid and salts thereof.

Other examples of the hydrophilic resin suitable for the present invention include hydrophilic graft polymers. The hydrophilic graft polymer indicates a graft polymer having a side chain formed of a polymer or copolymer containing, as a polymerization component, a monomer having a hydrophilic group (hereinafter sometimes referred to as a hydrophilic monomer). The copolymerization ratio of the hydrophilic monomer in the side chain copolymer is preferably 50 mol % or more, more preferably 80 mol % or more. The main chain may be formed of a hydrophilic monomer or a hydrophobic monomer or may be formed of both a hydrophilic monomer and a hydrophobic monomer.

Examples of the hydrophilic group include a carboxyl group and salts thereof, a carboxylic acid anhydride group, a sulfonic acid group and salts thereof, an amide group and a polyethyleneoxy group.

The monomer for use in the side chain may be any if it is a monomer having the above-described hydrophilic group but preferred examples thereof include an acrylic acid, a methacrylic acid, a maleic anhydride, an itaconic acid, an acrylamide, an N-alkylacrylamide (the alkyl group having from 1 to 6, preferably from 1 to 3, carbon atoms), a styrenesulfonic acid, a 2-acrylamido-2-methylpropanesulfonic acid, a vinylpyrrolidone and a monomer containing a polyethyleneoxy group. The acids each may be a salt thereof. Among these monomers, an acrylamide is preferred because of easiness in synthesis.

The weight average molecular weight of the side chain hydrophilic monomer polymer is preferably from 1,000 to 50,000, and the weight average molecular weight of the hydrophilic graft polymer is preferably from 5,000 to 500,000. Within this range, good on-press developability and good printing durability can be obtained.

The hydrophilic graft polymer can be obtained by polymerizing a macromonomer having a radical-polymerizable functional group at one terminal of a hydrophilic monomer polymer, such as acrylamide macromonomer, or copolymerizing this macromonomer and a monomer copolymerizable therewith.

In the image-forming layer for use in the present invention, a mixture of the hydrophilic graft polymer and the non-grafted hydrophilic resin may be used as the hydrophilic resin, if desired.

The amount of the hydrophilic resin added to the image-forming layer is preferably from 2 to 40%. Within this range, good on-press developability and high printing durability can be obtained.

In addition to the above-described compounds, an inorganic fine particle, a surfactant, a colorant, a plasticizer, a reaction accelerator and the like can be added to the image-forming layer of the present invention for various purposes, for example, for elevating the sensitivity, controlling the degree of hydrophilicity, increasing the physical strength of the image-forming layer, improving the mutual dispersibility of components constituting the layer, enhancing the coatability, improving the printing suitability or facilitating the plate-making work. These additives are described below.

The image-forming layer of the present invention may contain an inorganic fine particle and suitable examples of the inorganic fine particle include silica, alumina, magnesium oxide, titanium oxide, magnesium carbonate, calcium alginate and a mixture thereof. This inorganic fine particle may be used, even if it does not have light-to-heat converting property, for strengthening the film or for surface roughening and thereby strengthening the interface adhesion.

The average particle size of the inorganic fine particle is preferably from 5 nm to 10 μm, more preferably from 10 nm to 1 μm. With the particle size in this range, the inorganic particle can be stably dispersed in the hydrophilic resin together with the resin fine particle or the metal fine particle as a light-to-heat converting agent, so that the image-forming layer can maintain sufficiently high film strength and the non-image area formed can have excellent hydrophilicity and be difficult of staining at printing.

Such an inorganic fine particle is easily available on the market as a colloidal silica dispersion or the like. The amount of the inorganic fine particle contained in the image-forming layer is preferably from 1.0 to 70%, more preferably from 5.0 to 50%, based on the entire solid content of the image-forming layer.

In the image-forming layer of the present invention, a nonionic surfactant and an anionic surfactant and other than these, a cationic surfactant and a fluorine-containing surfactant described in JP-A-2-195356, and an amphoteric surfactant described in JP-A-59-121044 and JP-A-4-13149 can be added so as to improve the dispersion stability of the image-forming layer, elevate the plate-making and printing performance or enhance the coatability. The amount of the surfactant added is suitably from 0.005 to 1% based on the entire solid content of the hydrophilic layer.

Specific examples of the nonionic surfactant include polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene nonylphenyl ether; polyoxyethylene polyoxypropylene block copolymers; composite polyoxyalkylene alkyl ethers where an aliphatic group having from 5 to 24 carbon atoms is ether-bonded to the terminal hydroxyl group of a polyoxyethylene-polyoxypropylene block copolymer; composite polyoxyalkylene alkylaryl ethers where an alkyl-substituted aryl group is ether-bonded to the terminal hydroxyl group of a polyoxyethylene-polyoxypropylene block copolymer; sorbitan fatty acid esters such as sorbitan monolaurate, sorbitan monostearate, sorbitan tristearate, sorbitan monopalmitate, sorbitan monooleate and sorbitan trioleate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan tristearate and polyoxyethylene sorbitan trioleate.

Specific examples of the amphoteric surfactant include alkyldi(aminoethyl)glycine, alkylpolyaminoethyl glycine hydrochloride, 2-alkyl-N-carboxyethyl-N-hydroxyethylimidazolinium betaine, N-tetradecyl-N,N-betaine type (for example, AMORGEN K, trade name, produced by Daiichi Kogyo K.K.), and alkylaminoethyl carboxylate (for example, LIPOMIN LA, trade name, produced by Lion Corporation).

Specific examples of the anionic activator include alkylsulfonic acids, arylsulfonic acids, aliphatic carboxylic acids, alkylnaphthalenesulfonic acids, condensates of alkylnaphthalenesulfonic acid or naphthalenesulfonic acid and formaldehyde, aliphatic sulfonic acids having from 9 to 26 carbon atoms, alkylbenzenesulfonic acids, and polyoxyethylene-containing sulfuric or phosphoric acids such as lauryl polyoxyethylenesulfuric acid, cetyl polyoxyethylenesulfonic acid and oleyl polyoxyethylenephosphonic acid.

Specific examples of the cationic activator include laurylamine acetate, lauryl trimethylammonium chloride, distearyl dimethylammonium chloride and alkylbenzyl dimethylammonium chloride.

The fluorine-containing surfactant is preferably a surfactant having a perfluoroalkyl group and examples thereof include anionic surfactants having any one of carboxylic acid, sulfonic acid, sulfuric acid ester and phosphoric acid ester, cationic surfactants such as aliphatic amine and quaternary ammonium salt, betaine-type amphoteric surfactants, and nonionic surfactants such as aliphatic ester of polyoxy compound, and condensate of polyalkylene oxide or polyethylene imine.

In the image-forming layer of the present invention, a dye having a large absorption in the visible light region may be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Kagaku Kogyo K.K.), Victoria Pure Blue, Crystal Violet (CI42555), Methyl Violet (CI42535), Ethyl Violet, Rhodamine B (CI145170B), Malachite Green (CI42000), Methylene Blue (CI52015) and dyes described in JP-A-62-293247. Furthermore, pigments such as phthalocyanine-type pigment, azo-type pigment and titanium oxide can also be suitably used. The amount added is from 0.01 to 10% based on the entire solid content of the image-forming layer.

In the image-forming layer of the present invention, a plasticizer may be added, if desired, so as to impart flexibility or the like to the coating film. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In the case of adding microcapsules to the image-forming layer, a solvent in which the content dissolves and with which the wall material swells may be added to the microcapsule dispersion medium. By this solvent, the enclosed compound having a heat-reactive functional group can be accelerated to diffuse outside the microcapsule. This solvent can be selected from a large number of commercially available solvents, though this depends on the microcapsule dispersion medium, the construction material of microcapsule wall, the wall thickness, and the compound enclosed. For example, in the case of a water-dispersible microcapsule comprising a crosslinked polyurea or polyurethane wall, preferred examples of the solvent include alcohols, ethers, acetals, esters, ketones, polyhydric alcohols, amides, amines and aliphatic acids.

Specific examples thereof include methanol, ethanol, tertiary butanol, n-propanol, tetrahydrofurane, methyl lactate, ethyl lactate, methyl ethyl ketone, propylene glycol monomethyl ether, ethylene glycol diethyl ether, ethylene glycol monomethyl ether, γ-butyllactone, N,N-dimethylformamide and N,N-dimethylacetamide, however, the present invention is not limited thereto. These solvents may be used in combination of two or more thereof.

Also, a solvent which does not dissolve in the microcapsule dispersion solution but when mixed with the above-described solvent, dissolves in the microcapsule dispersion solution may be used. The amount added thereof varies depending on the combination of materials, however, if the amount added is less than the optimal amount, insufficient image formation results, whereas if it exceeds the optimal amount, the stability of dispersion solution deteriorates. Usually, the amount added is effectively from 5 to 95%, preferably from 10 to 90%, more preferably from 15 to 85%, based on the coating solution.

In the case of using the polymer fine particle having a heat-reactive functional group or the microcapsule, a compound capable of initiating or accelerating the reaction thereof may be added, if desired, to the image-forming layer of the present invention. The compound capable of initiating or accelerating the reaction includes a compound which generates a radical or a cation by heat. Examples thereof include lophine dimers, trihalomethyl compounds, peroxides, azo compounds, onium salts including diazonium salt and diphenyl iodonium salt, acyl phosphines and imidosulfonates. It is also possible to add this compound to the polymer fine particle or to the compound enclosed in the microcapsule. The amount of this compound added is preferably from 0.1 to 20%, more preferably from 0.5 to 10%, based on the solid content of the image-recording layer. Within this range, good reaction initiating or accelerating effect can be obtained without impairing the on-press developability.

In forming the image-forming layer of the present invention, necessary components described above are dissolved or dispersed in water or in a mixed solvent obtained by adding, if desired, an organic solvent, and the prepared coating solution is coated. The solid content concentration of the coating solution is preferably from 1 to 50%.

For coating the coating solution, various methods may be used. Examples thereof include bar coater coating, rotary coating, spray coating, curtain coating, dip coating, air knife coating, blade coating and roll coating. The coated amount (solid content) of the image-forming layer obtained after coating and drying on the support varies depending on the use end but in general, is preferably from 0.5 to 5.0 g/m$^2$, more preferably from 0.5 to 2.0 g/m$^2$.

The support for use in the present invention is a substrate having a hydrophilic surface or a substrate imparted with a hydrophilic surface, for example, by coating a hydrophilic layer. Specific examples of the support include paper; paper laminated with plastic (e.g., polyethylene, polypropylene, polystyrene); metal plate (e.g., aluminum, zinc, copper); plastic film (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal); paper or plastic film having laminated or deposited thereon the above-described metal; and these substrates where a hydrophilic layer is coated. Among these supports, preferred are an aluminum plate and a polyester film having coated thereon a hydrophilic layer.

The aluminum plate is a pure aluminum plate or an alloy plate mainly comprising aluminum and also containing trace heteroelements. An aluminum or aluminum alloy thin film laminated with a plastic may also be used. Examples of the heteroelement contained in the aluminum alloy include silicon, iron, manganese, copper, magnesium, chromium, zinc, bismuth, nickel and titanium. The content of heteroelements in the alloy is at most 10% or less. The aluminum plate may be an aluminum plate obtained from an aluminum ingot using a DC casting method or an aluminum plate obtained from an ingot by a continuous casting method. Also, an aluminum plate comprising conventionally known materials may be appropriately used as the aluminum plate for use in the present invention.

The thickness of the support for use in the present invention is from 0.05 to 0.6 mm, preferably from 0.1 to 0.4 mm, more preferably from 0.15 to 0.3 mm.

In advance of use, the aluminum plate is preferably subjected to a surface treatment such as surface roughening and anodization. By the surface treatment, it is facilitated to improve the hydrophilicity and ensure the adhesion to the image-forming layer.

The surface roughening of the aluminum plate is performed by various methods, for example, a method of mechanically roughening the surface, a method of electrochemically dissolving and thereby roughening the surface, or a method of chemically and selectively dissolving the surface. The mechanical method may be performed using a known method such as ball polishing, brush polishing, blast polishing or buff polishing. As for the chemical method, the method described in JP-A-54-31187 is suitably used, where the aluminum plate is dipped in a saturated aqueous solution containing an aluminum salt of a mineral acid. The electrochemical surface roughening method includes a method of applying alternating or direct current in an electrolytic solution containing an acid such as hydrochloric acid or nitric acid. Also, an electrolytic surface roughening method using a mixed acid described in JP-A-54-63902 may be used.

This surface roughening treatment is preferably applied to have a center line average roughness (Ra) of 0.2 to 1.0 μm on the surface of the aluminum plate.

The surface-roughened aluminum plate is, if desired, subjected to an alkali etching treatment using an aqueous solution of potassium hydroxide or sodium hydroxide and after a neutralization treatment, subjected to an anodization treatment, if desired, to enhance the abrasion resistance.

As for the electrolyte for use in the anodization treatment of the aluminum plate, various electrolytes of forming a porous oxide film may be used. In general, sulfuric acid, hydrochloric acid, oxalic acid, chromic acid or a mixed acid thereof is used. The concentration of the electrolyte is determined appropriately in accordance with the kind of the electrolyte.

The anodization treatment conditions vary depending on the electrolyte used and therefore, cannot be indiscriminately specified, however, in general, the concentration of the electrolyte is from 1 to 80% in the solution, the liquid temperature is from 5 to 70° C., the current density is from 5 to 60 A/dm$^2$, the voltage is from 1 to 100 V, and the electrolysis time is from 10 seconds to minutes. The amount of the oxide film formed is preferably from 1.0 to 5.0 g/m$^2$, more preferably from 1.5 to 4.0 g/m$^2$.

The substrate subjected to the above-described surface treatments and having an anodic oxide film may be used as it is for the support of the present invention, however, in order to more improve the adhesion to the upper layer, the hydrophilicity, the difficult staining, the heat insulating property and the like, a treatment for enlarging micropores of the anodic oxide film described in Japanese Patent Application Nos. 2000-65219 and 2000-143387, a treatment for sealing micropores, a surface hydrophilizing treatment of dipping the substrate in an aqueous solution containing a hydrophilic compound, and the like may be appropriately selected and performed.

Suitable examples of the hydrophilic compound used for the hydrophilization treatment include polyvinylphosphonic acid, compounds having a sulfonic acid group, saccharide compounds, citric acid, alkali metal silicates, potassium fluorozirconate, and phosphate/inorganic fluorine compounds.

In the case where a support having insufficient hydrophilicity on the surface, such as polyester film, is used as the support of the present invention, the surface must be rendered hydrophilic, for example, by coating a hydrophilic layer. The hydrophilic layer is preferably a hydrophilic layer described in Japanese Patent Application No. 2000-10810, which is formed by coating a coating solution comprising a colloid of an oxide or hydroxide of at least one element selected from beryllium, magnesium, aluminum, silicon, titanium, boron, germanium, tin, zirconium, iron, vanadium, antimony and transition metals. In particular, a hydrophilic layer formed by coating a coating solution containing an oxide or hydroxide of silicon is preferred.

In the present invention, an inorganic undercoat layer such as water-soluble metal salt (e.g., zinc borate) described in Japanese Patent Application No. 2000-143387, or an organic undercoat layer containing, for example, carboxymethyl cellulose, dextrin or polyacrylic acid may be provided, if desired, before coating the image-forming layer. This undercoat layer may contain the above-described light-to-heat converting agent.

In the lithographic printing plate precursor of the present invention, a hydrophilic overcoat layer may be provided on the image-forming layer so as to protect the surface of the hydrophilic image-forming layer from staining due to a lipophilic substance during storage, fingerprint staining due to contact of a finger at handling, or the like.

The hydrophilic overcoat layer for use in the present invention is a layer which can be easily removed on a press, and contains a resin selected from a water-soluble resin and a water-swellable resin obtained by partially crosslinking the water-soluble resin.

The water-soluble resin is selected from water-soluble natural polymers and synthetic polymers and used alone or together with a crosslinking agent to provide, when coated and dried, a coating having a film-forming ability.

Specific examples of water-soluble resins which are preferably used in the present invention include, as natural polymers, gum arabic, water-soluble soybean polysaccharide, cellulose derivatives (e.g., carboxymethyl cellulose, carboxyethyl cellulose, methyl cellulose) and modified products thereof, white dextrin, pullulan and enzymolysis etherified dextrin; and, as synthetic polymers, a polyvinyl alcohol (where the hydrolysis ratio of polyvinyl acetate is 65% or more), a polyacrylic acid and an alkali metal salt or amine salt thereof, a polyacrylic acid copolymer and an alkali metal salt or amine salt thereof, a polymethacrylic acid and an alkali metal salt or amine salt thereof, a vinyl alcohol/acrylic acid copolymer and an alkali metal salt or amine salt thereof, a polyacrylamide and a copolymer thereof, a polyhydroxyethyl acrylate, a polyvinylpyrrolidone and a copolymer thereof, a polyvinyl methyl ether, a polyvinyl methyl ether/maleic anhydride copolymer, a poly-2-acrylamido-2-methyl-1-propanesulfonic acid and an alkali metal salt or amine salt thereof, and a poly-2-acrylamido-2-methyl-1-propanesulfonic acid copolymer and an alkali metal salt or amine salt thereof. According to the purpose, these resins can be used in combination of two or more thereof. However, the present invention is not limited to these examples.

In the case of partially crosslinking at least one water-soluble resin and forming an overcoat layer on the image-forming layer, the crosslinking is preformed by causing a crosslinking reaction using the reactive functional group of the water-soluble resin. The cross-linking may be covalent bonding or ionic bonding.

By the crosslinking, the tackiness on the overcoat layer surface decreases and the lithographic printing plate precursor is improved in the handleability, however, if the crosslinking excessively proceeds, the overcoat layer becomes ink-receptive and can be difficultly removed on a press. Therefore, appropriate partial crosslinking is preferred. The preferred partial crosslinking is in such a degree that when a printing plate precursor is dipped in water at 25° C., the hydrophilic overcoat layer does not dissolve and remains for from 30 seconds to 10 minutes but dissolves after 10 minutes or more.

The compound (crosslinking agent) for use in the crosslinking reaction includes known polyfunctional compounds having crosslinking property and examples thereof include polyepoxy compounds, polyamine compounds, polyisocyanate compounds, polyalkoxysilyl compounds, titanate compounds, aldehyde compounds, polyvalent metal salt compounds and hydrazine.

The crosslinking agents can be used individually or as a mixture of two or more. Out of the crosslinking agents, preferred is a water-soluble crosslinking agent. In the case of a water-insoluble compound, the crosslinking agent can be used by dispersing it in water using a dispersant.

Preferred combinations of a water-soluble resin and a crosslinking agent are a carboxylic acid-containing water-soluble resin/a polyvalent metal compound, a carboxylic acid-containing water-soluble resin/a water-soluble epoxy resin, and a hydroxyl group-containing resin/dialdehyde.

The amount of the crosslinking agent added is suitably from 2 to 10% of the water-soluble resin. Within this range, good water resistance can be obtained without impairing the removability of overcoat layer on a press.

The overcoat layer can contain a light-to-heat converting agent so as to elevate the sensitivity. Preferred examples of the light-to-heat converting agent include water-soluble infrared absorbing dyes and specific examples thereof include infrared absorbing dyes having a water-soluble group, which are described above regarding the image-forming layer.

In addition, the overcoat layer may contain, in the case of coating it as an aqueous solution, mainly a nonionic surfactant so as to ensure uniformity of the coating. Specific examples of the nonionic surfactant include sorbitan tristearate, sorbitan monopalmitate, sorbitan trioleate, stearic acid monoglyceride, polyoxy-ethylenenonylphenyl ether and polyoxyethylene dodecyl ether. The ratio of the nonionic surfactant occupying in the entire solid content of the overcoat layer is preferably from 0.05 to 5%, more preferably from 1 to 3%.

The thickness of the overcoat layer of the present invention is, in the case where the water-soluble resin is not crosslinked, preferably from 0.1 to 4.0 μm, more preferably from 0.1 to 1.0 μm, and in the case where the water-soluble resin is partially crosslinked, preferably from 0.1 to 0.5 μm, more preferably from 0.1 to 0.3 μm. Within this range, the image-forming layer can be prevented from staining due to lipophilic substances without impairing the removability of overcoat layer on a press.

The on-press developing method of the present invention is characterized in that when a lithographic printing plate precursor having an image-forming layer containing the above-described hydrophobizing precursor is on-press developed, the hydrophobizing precursor mingled into the fountain solution is aggregated and filtered. The method for aggregating the fine particles is not particularly limited but the fine particles can be easily aggregated, for example, by adding a coagulant to the fountain solution. Impurities such as hydrophobizing precursor fine particles present in the fountain solution are aggregated and efficiently filtered as an agglomerate and thereby the fountain solution can be clarified.

The aggregation is a phenomenon where in view of mechanism, the chemical, physical and electrical forces are complicatedly related. This phenomenon generally takes place upon addition of a small amount of (1) an electrolyte, (2) a metal oxide or (3) a surfactant/polymer compound. For the convenience's sake, the coagulant of bringing about the aggregation is classified into a low molecular coagulant and a high molecular coagulant. In each coagulant, a large number of species are known.

A representative substance as a low molecular coagulant for use in the present invention is an inorganic coagulant. Examples of the inorganic coagulant include aluminum-base substances such as aluminum sulfate (alumina sulfate) and polyaluminum chloride (PAC), iron-base substances such as ferric chloride, ferrous sulfate and ferric sulfate, zinc chloride, titanium tetrachloride and sodium aluminate. Furthermore, various inorganic electrolytes are effective and examples thereof include fluoride, chloride, bromide, iodide, hydroxide, carbonate and sulfate of an alkali metal or an alkaline earth metal. Also, a polymerized silicic acid (active silicic acid) in a colloidal state obtained by adding a dilute acid to a dilute solution of sodium silicate is effective.

The low molecular coagulant also includes nonionic, anionic, cationic, amphoteric and fluorine-containing various surfactants. Specifically, the same surfactants as those which can be added to the image-forming layer can be used.

Main examples of the high molecular coagulant for use in the present invention include polymers or copolymers containing, as a monomer unit, acrylamide, diarylamine, maleimide, fumaric acid monoamide, vinylamine, vinylimidazole, vinylpyridine, N,N-dialkylaminoethyl acrylate, acrylic acid or the like; anionic derivatives where an anion group from a carboxylic acid, a sulfonic acid, a phosphonic acid or the like is introduced into the above-described polymers or copolymers; cationic derivatives where a cation group such as ammonium group is introduced; and amphoteric derivatives where both an anion group and a cation group are introduced.

Specific examples of suitable high molecular coagulants are set forth below, however, the present invention is not limited thereto. In the following, "FA" stands for an anionic derivative, "FC" stands for a cationic derivative and "FT" stands for an amphoteric derivative.

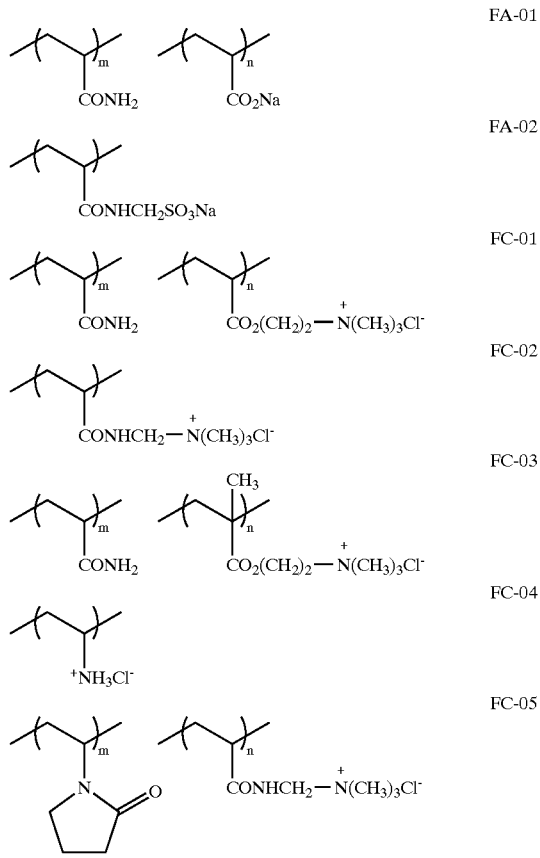

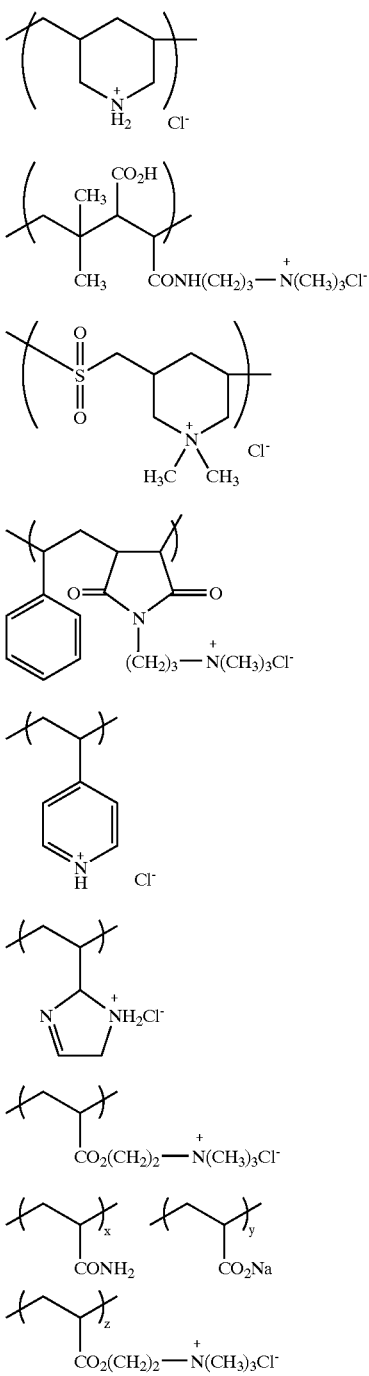

Other than the compounds set forth above as specific examples, a polyethyleneimine-base cationic coagulant, an amidine-base cationic coagulant, a polycondensate of alkylene dichloride and alkylene polyamine, a polycondensate of alkylene diamine and epichlorohydrin, a polycondensate of ammonia and epichlorohydrin, a polycondensate of aspartic acid and hexaethylene diamine, a sodium polyacrylate, a sodium alginate, guar gum, starch, a sodium salt of carboxymethyl cellulose, gelatin, chitosan and the like may be used.

The weight average molecular weight indicates the molecular size of a high molecular coagulant and in general, as the molecular weight is larger, the cohesive strength is higher. In the present invention, the weight average molecular weight is preferably from 1,000 to 3,000,000, more preferably from 5,000 to 1,000,000.

As for the shape of the high molecular coagulant, an emulsion form and a dispersion form can be used in addition to the powder form.

The ionicity of the high molecular coagulant is an important property in neutralizing the electric charge or aggregating particles at the time of aggregating dispersed particles. The amount of functional group showing this ionicity can be expressed by the mol % as a number of ionic units to all units of the high molecular coagulant and is preferably from 0.01 to 100 mol %, more preferably from 1 to 90 mol %.

The amount of the coagulant added varies depending on the kind of the coagulant and cannot be indiscriminately specified, however, in general, the amount added is preferably from 0.001 to 20%, more preferably from 0.01 to 10% based on the amount of the fountain solution. Within this range, the hydrophobizing precursor mingled into the fountain solution can be successfully aggregated. If the coagulant is excessively present, the adsorption active points present on the grain surface all are occupied by the coagulant molecule and the grain surface is equally charged, as a result, the original crosslinking activity of the coagulant is not exerted. Moreover, the coagulant itself is an electrolyte and has strong hydrophilicity and therefore, the grain is embraced by the coagulant due to its protective colloid function and is stabilized. As a result, the grains are in the dispersed state and the aggregating activity is not exerted. On the other hand, if the amount of the coagulant added is too small, the electric charge on the grain surface cannot be satisfactorily cancelled and the aggregating activity is not exerted.

The fountain solution in which the coagulant is added is used in a press having a fountain solution-circulating and feeding apparatus with a filter device. The agglomerate of the hydrophobizing precursor, which is produced by the coagulant, is filtered through the filter device and the fountain solution is clarified. The fountain solution may also be used in the methods described in JP-A-8-132754, JP-A-10-175284, JP-A-10-296002, JP-A-2000-176444 and JP-A-2000-351193.

As for the construction material of the filter, a woven fabric comprising a natural fiber such as cotton or kapok fiber, a synthetic fiber, a glass fiber, a stainless steel cloth, an iron cloth or the like, or a non-woven fabric such as filter paper, synthetic resin product, felt or asbestos can be used. Examples of the synthetic fiber which can be used include a vinyl acetate-base fiber, a polyamide-base fiber, a vinyl chloride-base fiber, an acrylic fiber, an ethylene-base fiber and a propylene-base fiber. In order to attain good performance and handleability, the filter material is usually used by forming it into a bag filter, a cartridge filter or the like. The filter may be an activated carbon filter or a potential adsorption filter. However, the filter is not limited thereto and any filter may be used insofar as the agglomerate of the hydrophobizing precursor, produced by the coagulant, can be efficiently separated by filtration.

The fountain solution-clarifying means of the present invention can be applied to a fountain solution-circulating and feeding apparatus individually attached to a press and also to a fountain solution-circulating and feeding apparatus in a centralized control system for a plurality of presses.

Using this fountain solution-clarifying means, the fountain solution consumed is replenished while controlling the coagulant concentration in a suitable range, whereby on-press development can be performed for a long period of time without causing generation of printing staining.

In advance to the on-press development, an image is recorded on the lithographic printing plate precursor by exposure or the like. To speak specifically, direct imagewise recording by a thermal recording head or the like, scan exposure by an infrared laser, high-illuminance flash exposure by a xenon discharge lamp, infrared lamp exposure or the like is used, however, exposure by a semiconductor laser of radiating a near infrared ray at a wavelength of 700 to 1,200 nm or a solid high-output infrared laser such as YAG laser is preferred.

In the case of exposure by a near infrared laser, the irradiation can be performed using a laser having a laser output of 0.1 to 300 W. In the case of using a pulse laser, the irradiation is preferably performed by a laser having a peak output of 1,000 W, more preferably 2,000 W. As for the exposure amount at this time, the plane exposure strength before the modulation by an image for printing is 2 preferably from 0.1 to 10 $J/cm^2$, more preferably from 0.3 to 1 $J/cm^2$. When the support is transparent, the exposure may also be made through the support from the back side of the support.

The imagewise exposed lithographic printing plate precursor is fixed on a plate cylinder of a press equipped with a fountain solution-circulating apparatus having the above-described clarifying means, without passing through any more processing. Thereafter, the lithographic printing plate precursor is on-press developed by a normal printing initiating operation of supplying a fountain solution and an ink and further feeding paper and then used as a printing plate.

The lithographic printing plate precursor of the present invention may also be fixed on a plate cylinder of a press, exposed by a laser exposure device mounted on the press and then on-press developed.

EXAMPLES

The present invention is described in greater detail below by referring to Examples, however, the present invention is not limited by these Examples.

Manufacture Example (1) of Lithographic Printing Plate Precursor

An aluminum plate (construction material: JIS A1050, thickness: 0.24 mm) was electrolytically grained in a nitric acid bath and then anodized in a sulfuric acid bath by a known method and then treated with an aqueous silicate solution. The Ra (center line surface roughness) of the support was 0.25 μm, the amount of the anodic oxide film was 2.5 $g/m^2$, and the amount of silicon adhered was 10 $mg/m^2$. On this aluminum support, an undercoat solution comprising a 0.25% methanol solution of polyacrylic acid (weight average molecular weight: 250,000) was coated in a coating solution amount of 10 $g/m^2$ and then dried at 100° C. for 60 seconds to manufacture an aluminum substrate having an undercoat in a dry coated weight of 25 $mg/M^2$.

On this substrate, a coating solution for the image-forming layer, prepared as follows, was coated in a coating solution amount of 20 $g/m^2$ and dried at 100° C. for 60 minutes to manufacture Lithographic Printing Plate Precursor (1) having an image-forming layer in a dry coated weight of 1.0 $g/m^2$.

(Manufacture of Coating Solution for Image-Forming Layer)

To 5 g of a 20% dispersion solution of polystyrene (Tg: 100° C., average particle diameter: 90 nm) dispersed in deionized water using a nonionic surfactant, 0.10 g of a light-to-heat converting agent (IR-10 in the specification), 0.024 g of polyoxyethylene nonylphenyl ether and 15.46 g of deionized water were continuously added and finally, 6 g of a 5% aqueous solution of polyvinyl alcohol (PVA205, produced by Kuraray) was added while stirring.

Manufacture Example (2) of Lithographic Printing Plate Precursor

Lithographic Printing Plate Precursor (2) was manufactured in the same manner as in Example 1 except that a microcapsule produced by the following preparation method was used in place of the polystyrene fine particle described in Manufacture Example (1) of Lithographic Printing Plate Precursor.

(Preparation of Microcapsule)

In 60 g of ethyl acetate, 40 g of D-110N (produced by Takeda Chemical Industries, Ltd.), 10 g of trimethylol propane diacrylate, 10 g of an allyl methacrylate and butyl methacrylate copolymer (molar ratio: 7/3), 5.0 g of a light-to-heat converting agent (IR-23 in the specification) and 0.1 g of PIONIN A41C (produced by Takemoto Yushi) were dissolved to prepare an oil phase component. Separately, 120 g of a 4% aqueous solution of polyvinyl alcohol (PVA205, produced by Kuraray Co., Ltd.) was prepared as an aqueous phase component. The oil phase component and the aqueous phase component were emulsified by a homogenizer at 10,000 rpm. Thereafter, 40 g of water was added and the solution was stirred at room temperature for 30 minutes and further at 40° C. for 3 hours. The thus-obtained microcapsule solution had a solid content concentration of 20% and an average particle size of 0.5 μm.

Example 1

Lithographic Printing Plate Precursor (1) produced above was fixed on Trendsetter manufactured by CREO Corporation (a plate setter having mounted thereon a 830 nm semiconductor laser of 40 W) and exposed with an energy of 40 $mJ/cm^2$ to form a 30% flat tint image of 175 dpi on the entire surface of the plate. The exposed plate was fixed as it is on a press without passing through any more processing. Then, 1,000 sheets were printed using a press HARRIS AURELIA equipped with a fountain solution-circulating apparatus having a filter device, a fountain solution containing 4% of a non-alcohol fountain solution IF-102 (produced by Fuji Photo Film Co., Ltd.) and 0.5% of a high molecular coagulant (FA-01 in the specification), and a GEOS-G Sumi N ink (produced by Dainippon Ink & Chemicals, Inc.). As a result, good printed matters free of background staining were obtained. Furthermore, 50 plates were continuously subjected to on-press development and printing operation in the same manner while replenishing the fountain solution and the high molecular coagulant to give the same solution composition, without exchanging the solution. Even under these continuous use conditions, all printed matters were completely free of background staining.

Examples 2 to 8

Evaluation on continuous use of 50 plates was performed in the same manner as in Example 1 except that the coagulant of Example 1 and the amount added thereof were changed to the compound and the amount shown in Table 1. As Comparative Example 1, evaluation on continuous use was performed by not adding a coagulant. The results obtained are shown in Table 1.

TABLE 1

Examples 2 to 8 and Comparative Example 1

| | Kind | Amount Added (%) | Results of Printing |
|---|---|---|---|
| Example 2 | FC-01 | 0.5 | Good |
| Example 3 | FC-05 | 1.0 | Good |
| Example 4 | FT-01 | 2.0 | Good |
| Example 5 | aluminum sulfate | 0.1 | Good |
| Example 6 | potassium chloride | 1.5 | Good |
| Example 7 | sodium aluminate | 0.3 | Good |
| Example 8 | sodium alkylaminoethyl carboxylate (LIPOMIN LA, trade name, produced by Lion Corp.) | 0.5 | Good |
| Comparative Example 1 | none | | Background staining was generated from 15th plate. |

Example 9

Evaluation on continuous use was performed in the same manner as in Example 1 except that Lithographic Printing Plate Precursor (2) was used in place of Lithographic Printing Plate Precursor (1) used in Example 1. As a result, even when 50 plates were continuously used similarly to Example 1, all printed matters were completely free of background staining.

From these results, it is seen that by adding a coagulant to the fountain solution, printing staining which is generated on continuing the on-press development can be prevented.

According to the present invention, an on-press developing method where problems such as deterioration of on-press developability or generation of printing staining do not arise even when on-press development of a lithographic printing plate precursor having an image-forming layer containing a hydrophobizing precursor is continued, can be provided.

This application is based on Japanese Patent application JP 2001-354809, filed Nov. 20, 2001, the entire content of which is hereby incorporated by reference, the same as if set forth at length.

What is claimed is:

1. An On-press developing method of a lithographic printing plate precursor, the lithographic printing plate precursor comprising an image-forming layer which comprises a hydrophobizing precursor, and the method comprising fountain solution-clarifying means which comprises:

aggregating a hydrophobizing precursor mingled in a fountain solution; and removing the aggregated hydrophobizing precursor by filtration.

2. An On-press developing method of a lithographic printing plate precursor, the lithographic printing plate precursor comprising an image-forming layer which comprises a hydrophobizing precursor, and the method comprising fountain solution-clarifying means which comprises:

adding a coagulant to a fountain solution; and filtering the fountain solution.

3. The On-press developing method according to claim 1, wherein the hydrophobizing precursor is a thermoplastic polymer particle, a thermosetting polymer particle, a polymer particle having a heat-reactive functional group, and a microcapsule enclosing a hydrophobic substance.

4. The On-press developing method according to claim 2, wherein the hydrophobizing precursor is a thermoplastic polymer particle, a thermosetting polymer particle, a polymer particle having a heat-reactive functional group, and a microcapsule enclosing a hydrophobic substance.

5. The On-press developing method according to claim 1, wherein the hydrophobizing precursor has an average particle size of from 0.01 to 20 $\mu$m.

6. The On-press developing method according to claim 2, wherein the hydrophobizing precursor has an average particle size of from 0.01 to 20 $\mu$m.

7. The On-press developing method according to claim 1, wherein the image-forming layer comprises 20% or more of the hydrophobizing precursor in terms of a solid content, based on a solid content of the image-forming layer.

8. The On-press developing method according to claim 2, wherein the image-forming layer comprises 20% or more of the hydrophobizing precursor in terms of a solid content, based on a solid content of the image-forming layer.

9. The On-press developing method according to claim 2, wherein the coagulant is added in an amount added of from 0.001 to 20% based on an amount of the fountain solution.

10. The On-press developing method according to claim 2, wherein the coagulant is added in an amount added of from 0.01 to 10% based on an amount of the fountain solution.

11. The On-press developing method according to claim 2, wherein the coagulant is an inorganic coagulant, a cationic surfactant, an amphoteric surfactant, an anionic high molecular coagulant or a cationic high molecular coagulant.

12. The On-press developing method according to claim 1, wherein the lithographic printing plate precursor further comprises a hydrophilic overcoat layer provided on the image-forming layer.

13. The On-press developing method according to claim 2, wherein the lithographic printing plate precursor further comprises a hydrophilic overcoat layer provided on the image-forming layer.

* * * * *